(12) United States Patent
Antonetti et al.

(10) Patent No.: US 10,285,469 B2
(45) Date of Patent: May 14, 2019

(54) INSOLE FOR CONTROLLING AND ADJUSTING THE TEMPERATURE OF THE FOOT

(71) Applicant: ARIA S.R.L., Milan (IT)

(72) Inventors: Alessandra Antonetti, Milan (IT); Eros Brienza, Milan (IT)

(73) Assignee: ARIA S.R.L., Milan MI (IT)

( * ) Notice: Subject to any disclaimer, the term of this patent is extended or adjusted under 35 U.S.C. 154(b) by 123 days.

(21) Appl. No.: 15/687,382

(22) Filed: Aug. 25, 2017

(65) Prior Publication Data

US 2018/0055140 A1 Mar. 1, 2018

(30) Foreign Application Priority Data

Aug. 26, 2016 (IT) .................. 102016000087478

(51) Int. Cl.
  *A43B 7/02* (2006.01)
  *A43B 7/04* (2006.01)
  (Continued)

(52) U.S. Cl.
  CPC .............. *A43B 7/04* (2013.01); *A43B 3/0005* (2013.01); *A43B 7/005* (2013.01); *A43B 7/02* (2013.01); *A43B 17/006* (2013.01); *A43B 17/14* (2013.01); *G01K 13/002* (2013.01); *H01L 35/30* (2013.01); *H01L 35/32* (2013.01); *H05K 1/028* (2013.01); *H05K 2201/10151* (2013.01); *H05K 2201/10219* (2013.01)

(58) Field of Classification Search
  CPC ......... A43B 3/0005; A43B 7/02; A43B 7/025; A43B 7/04
  USPC .................................................... 36/136, 2.6
  See application file for complete search history.

(56) References Cited

U.S. PATENT DOCUMENTS

| | | | |
|---|---|---|---|
| 2011/0107771 A1* | 5/2011 | Crist .................. | A43B 3/0005 62/3.3 |
| 2011/0220634 A1* | 9/2011 | Yeh ...................... | A43B 3/0005 219/482 |

(Continued)

FOREIGN PATENT DOCUMENTS

| | | |
|---|---|---|
| WO | WO 2005/087031 A1 | 9/2005 |
| WO | WO/2010/085163 A1 | 7/2010 |
| WO | WO 2015/189691 A2 | 12/2015 |

OTHER PUBLICATIONS

Search Report and Written Opinion dated Jun. 29, 2017 by the Italian Patent Office in the related Italian Application No. 102016000087478.

*Primary Examiner* — Marie D Bays
(74) *Attorney, Agent, or Firm* — Hershkovitz & Associates, PLLC; Abe Hershkovitz (57) ABSTRACT

An insole for controlling and adjusting the temperature of the foot. The insole includes a first heat conductive layer made of fabric, a second heat insulating layer comprising a Peltier cell. The Peltier cell includes a first surface and has a predetermined polarity such that, when the Peltier cell is on, the first surface is heated or cooled. A third heat dissipating layer includes an accelerometer and a logic control unit connected to the accelerometer and to the Peltier cell. The insole further includes a first flexible printed circuit configured to measure the temperature of the foot, through at least a first temperature sensor and the temperature of the first surface of the Peltier cell, through a further first temperature sensor.

20 Claims, 4 Drawing Sheets

(51) Int. Cl.
*A43B 7/00* (2006.01)
*A43B 3/00* (2006.01)
*A43B 17/00* (2006.01)
*A43B 17/14* (2006.01)
*G01K 13/00* (2006.01)
*H01L 35/30* (2006.01)
*H01L 35/32* (2006.01)
*H05K 1/02* (2006.01)

(56) References Cited

U.S. PATENT DOCUMENTS

| | | | |
|---|---|---|---|
| 2014/0182164 A1* | 7/2014 | Krupenkin | A43B 7/02 36/2.6 |
| 2015/0001199 A1* | 1/2015 | Jeon | A43V 7/025 219/201 |
| 2016/0051006 A1* | 2/2016 | Dakhil | A43B 7/02 36/44 |
| 2016/0262924 A1* | 9/2016 | Abreu | A43B 7/04 |
| 2016/0334813 A1* | 11/2016 | Park | G05D 23/19 |

\* cited by examiner

INSOLE FOR CONTROLLING AND ADJUSTING THE TEMPERATURE OF THE FOOT

The present invention relates to an insole configured for controlling and adjusting the temperature of the foot.

More specifically, the invention relates to the structure of a sole that allows to control and adjust the temperature of a foot within a shoe.

Currently, different insoles are known for controlling the temperature of the foot inside a shoe.

A first example of a known type of insole is described in international patent application WO2010/085163.

Said insole consists of three layers: a first conductive layer, a second conductive layer, and a third insulating layer interposed between said first conductive layer and said second conductive layer.

In particular, said insole is provided with two Peltier cells and a temperature sensor positioned within the third insulating layer and is removably fixed to a sole having an electronic control circuit for controlling said Peltier cell.

However, this known type of insole has disadvantages.

A first disadvantage is the fact that it is not possible to use a different sole from that to which said known insole is fixed, since the electronic control circuit is within the third insulating layer.

Another disadvantage is that the temperature sensor is positioned inside the third insulating layer of the insole and consequently the temperature detection may be affected by the fact that the third layer is insulating.

A second example of a known type of insole is described in the international patent application WO2005/087031.

Said insole is able to heat up and cool down through a Peltier cell applied during the molding phase to the insole itself.

In addition to the Peltier cell, the insole is equipped with a switch to regulate the temperature of the foot at a desired temperature, an electronic circuit to activate the Peltier cell, a battery or an accumulator for supplying the Peltier cell, as well as a socket to recharge this battery or accumulator.

However, even this known type of insole has disadvantages.

One disadvantage is given by the fact that the insole is unable to control the temperature, with the risk that the foot may be damaged.

Object of the present invention is to overcome those disadvantages by providing an insole having a configured structure for controlling and adjusting the foot temperature to ensure a substantially constant temperature to the foot inside the shoe.

Therefore the object of the invention is an insole for controlling and adjusting the temperature of a foot, comprising from top to bottom:
a first heat conductive layer made of fabric, comprising a first surface intended to contact said foot, and a second surface, opposite to said first surface;
a second heat insulating layer, comprising a first surface in contact with the second surface of said first heat conductive layer, and a second surface, opposite to said first surface, where said second heat insulating layer has a through hole, arranged substantially at the center of the foot sole, inside which a Peltier cell is arranged, said Peltier cell comprising a first surface and a second surface, opposite to said first surface, where said first surface of said Peltier cell at least partially contacts the second surface of said first heat conductive layer; said Peltier cell having a predetermined polarity such that, when the Peltier cell is turned on, the first surface of said Peltier cell is heated or cooled;
a third heat dissipating layer, comprising a first surface having shape and dimensions such as to contact at least partially said second surface of said second heat insulating layer at the second surface of said cell Peltier, where said third heat dissipating layer comprises:
a first seat housing an accelerometer and a logic control unit, where said logic control unit is connected to said accelerometer and, via an H-bridge, to said cell Peltier, and a second seat housing power supply means, connected to said logic control unit, for supplying said logic control unit and said Peltier cell, as well as said accelerometer.

Said insole further comprises a first flexible printed circuit configured to measure the temperature of the foot and the first surface of the Peltier cell, comprising a first portion, connected to the logic control unit, a second portion, arranged in contact to the first surface of the Peltier cell, and a third portion, arranged in contact with the first surface of said second heat insulating layer.

Said first flexible printed circuit comprises at least one first temperature sensor for detecting the temperature of the foot in a respective foot point, arranged inside said third portion of said flexible printed circuit, and at least one further first temperature sensor for detecting the temperature in a respective point of said first surface of said Peltier cell, arranged inside said second portion of said flexible printed circuit.

Said accelerometer is configured to detect an acceleration and send a signal to said logic control unit to communicate that an acceleration has been detected or has not been detected in a predetermined period of time, and said logic control unit is connected to said at least one first temperature sensor and said at least one further first temperature sensor, by means of said flexible printed circuit, and is configured to:
communicate with said accelerometer to know whether a foot is in contact with said insole,
turn on and off said Peltier cell, said at least one first temperature sensor, said at least one further first temperature sensor, respectively, when the foot is in contact with said insole and when the foot is not in contact with said insole,
acquiring the temperature value detected by said at least one first temperature sensor,
comparing the said temperature value detected by said at least one first temperature sensor with a predetermined temperature range comprised between a predetermined first temperature threshold and a predetermined second temperature threshold, where said predetermined second temperature threshold is greater than said predetermined first temperature threshold,
turn on the Peltier cell so that its first surface is heated or cooled, when said temperature value is less than said predetermined first temperature threshold or greater than said predetermined second threshold temperature, or turn on the cell Peltier and reverse said predetermined polarity of said Peltier cell via said H-bridge, so that the first surface is cooled or heated, when said temperature value is greater than said predetermined second temperature threshold or less than the predetermined first temperature threshold,
acquiring the temperature value detected by said further first temperature sensor, comparing said temperature value acquired from said further first temperature sensor with a predetermined third temperature threshold, turn off the Peltier cell when said temperature value of said first surface of the Peltier cell is higher or lower than the predetermined third temperature threshold.

In particular, said second heat insulating layer may comprise a third seat, arranged on its first surface, and that third portion of said first flexible printed circuit can be housed in said third seat.

More specifically, said third portion can be pronged and in said third seat can be substantially Y-shaped and comprises:

- a first branch extending substantially from the center of the foot to a first foot point, substantially disposed between the second cuneiform and the third cuneiform,
- a second branch extending substantially from said first foot point to a second foot point, substantially disposed between the metatarsal bone and the proximal phalanx of the big toe, and
- a third branch extending substantially from said first foot point to a third foot point, substantially disposed between the metatarsal bone and the proximal phalanx of the fifth toe.

It is preferable that said at least one first temperature sensor is arranged substantially at said first foot point.

Furthermore, said flexible printed circuit may comprise inside a second temperature sensor, arranged substantially at said second foot point, and a third temperature sensor, arranged substantially at said third foot point and said logic control unit may be connected to said second temperature sensor and said third temperature sensor, by means of said flexible printed circuit, and may be configured to:

- acquire the temperature values detected by said second temperature sensor and said third temperature sensor,
- calculate the temperature average value between the temperature values of said first temperature sensor, said second temperature sensor and said third temperature sensor,
- compare said temperature average value with said predetermined temperature range comprised between said first threshold temperature and said second temperature threshold,
- turn on the Peltier cell so that the first surface is heated or cooled, when said temperature average value is less than said predetermined first temperature threshold or higher than the second temperature threshold, or turn on the Peltier cell and reverse said predetermined polarity of said Peltier cell via said H-bridge, so that the first surface is cooled or heated, when said average temperature value is greater than said predetermined second threshold temperature or lower than said predetermined first temperature threshold.

Said first flexible printed circuit may comprise inside a further second temperature sensor for detecting the temperature of said first surface of said Peltier cell, arranged inside said second portion of said first flexible printed circuit, and said logic control unit may be connected to said further second temperature sensor, by means of said flexible printed circuit, and is configured to:

- acquire the temperature value from said further second temperature sensor,
- calculate the average temperature value between the temperature values of said further first temperature sensor and said further second temperature sensor,
- compare said average temperature value of said first surface of the Peltier cell with said predetermined third temperature threshold,
- turn off the Peltier cell when said temperature average value of said first surface of the Peltier cell is higher or lower than the predetermined third temperature threshold.

According to the invention, said insole may comprise a second flexible printed circuit configured to measure the temperature of the second surface of the Peltier cell, comprising a first portion, connected to said logic control unit, and a second portion, arranged in contact with the second surface of said Peltier cell, where said second surface of said Peltier cell contacting at least partially the first surface of said third heat dissipating layer.

In particular, said second flexible printed circuit may comprise a further third temperature sensor for detecting the temperature of said second surface of said Peltier cell, arranged inside said second portion of said second flexible printed circuit, and said logic control unit may be connected to said further third temperature sensor, by means of said second flexible printed circuit, and is configured to:

- acquire the temperature value from said further third temperature sensor,
- compare said temperature value of said second surface of the Peltier cell with a predetermined fourth temperature threshold,
- turn off the Peltier cell when said temperature value of said second surface of the Peltier cell is higher or lower than the predetermined fourth temperature threshold.

Furthermore, said logic control unit may be configured to:

- verify whether the temperature value of said further third temperature sensor is lower than a predetermined fifth temperature threshold or greater than a predetermined sixth temperature threshold,
- turn off the Peltier cell until said temperature value is less than said fifth predetermined threshold temperature or higher than the predetermined sixth temperature threshold.

Said second flexible printed circuit comprises a further fourth temperature sensor for detecting the temperature of said second surface of said Peltier cell, arranged inside said second portion of said second flexible printed circuit, and said logic control unit may be connected to said further fourth temperature sensor, by means of said second flexible printed circuit, and is configured to:

- acquire the temperature value from said further fourth temperature sensor,
- calculate the temperature average value of said second surface of the Peltier cell between the temperature values of said further third temperature sensor and said further quarter of a temperature sensor,
- compare said average temperature value of said second surface of the Peltier cell with said fourth predetermined temperature threshold,
- turn off the Peltier cell when said average temperature value of said second surface of the Peltier cell is higher or lower than the predetermined fourth temperature threshold.

Furthermore, said logic control unit may be configured to:

- verify if said temperature average value between the temperature values of said further third temperature sensor and said further fourth temperature sensor is lower than a predetermined fifth temperature threshold or greater than a predetermined sixth temperature threshold, turn off the Peltier cell until said average temperature value is less than said fifth predetermined temperature threshold or higher than the predetermined sixth temperature threshold.

In a first form embodiment, said first heat conductive layer may comprise a predetermined first amount of graphene and a predetermined first amount of polymeric matrix material, and said third heat dissipating layer may comprise a predetermined second amount of graphene and a predetermined second amount of polyurethane, where said second predetermined amount of graphene is greater than said predetermined first amount of graphene.

In a second embodiment, said first heat conductive layer is a fabric of fibers of silver, in particular a Silverell© fabric, and said third heat dissipating layer may comprise a predetermined second amount of graphene and a predetermined second amount of polyurethane, where said predetermined second amount of graphene is between 3% and 20%, and said predetermined second amount of polyurethane is between 80% and 97%.

With reference to said predetermined temperature range, included between a predetermined first temperature threshold and a predetermined second temperature threshold, it is preferable that said predetermined temperature range is centered on a temperature value equal to 36.5° C. and said predetermined first temperature threshold is 30.5° C. and said second temperature threshold is 42.5° C.

With reference to the accelerometer, said accelerometer may be a three-axis accelerometer or a six-axis accelerometer or a nine-axis accelerometer.

The present invention is referred to a shoe comprising an insole mentioned above.

The present invention will now be described, for illustrative but not limitative purposes, according to one embodiment, with particular reference to the attached figures, in which.

With particular reference to FIGS. 1-5D, is described an insole for controlling and adjusting the temperature of the foot.

Said insole comprising from top to bottom:
a first heat conductive layer 1 made of fabric, comprising a first surface 1A intended to contact said foot, and a second surface 1B, opposite to said first surface 1A;
a second heat insulating layer 2, comprising a first surface 2A in contact with the second surface 1B of said first heat conductive layer 1, and a second surface 2B, opposite to said first surface 2A, where said second heat insulating layer 2 has a through hole 200, arranged substantially at the center of the foot sole, inside which a Peltier cell CP is arranged with a predetermined polarity and comprising a first surface CP1 and a second surface CP2, opposite to said first surface CP1;
a third heat dissipating layer 3, comprising a first surface 3A and a second surface 3B, opposite to said first surface 3A, where said first surface 3A has shape and dimensions such as to contact at least partially the second surface 2B of said second heat insulating layer 2 at the second surface CP2 of the Peltier cell CP, where said third heat dissipating layer 3 comprises:
a first seat 31 housing an accelerometer AC to detect a variation in speed over time and a logic control unit MC, where said logic control unit MC is connected to said accelerometer AC and, via an H-bridge indicated with the reference HB, to said Peltier cell CP, and is configured to communicate with said AC accelerometer in order to detect if a foot is in contact with the insole as well as to turn on/turn off said Peltier CP cell and reverse the polarity of said Peltier CP cell through said H-bridge,
a second seat 32 housing power supply means MA, connected to said logic control unit MC, for supplying said logic control unit MC and said Peltier cell, as well as said accelerometer AC.

Said insole further comprising a first flexible printed circuit 21 configured to measure the temperature of the foot and the first surface CP1 of the Peltier cell CP, and a second flexible printed circuit 22 configured to measure the temperature of the second CP2 surface of the Peltier CP cell, each connected to said logic control unit MC.

Figure 5A:
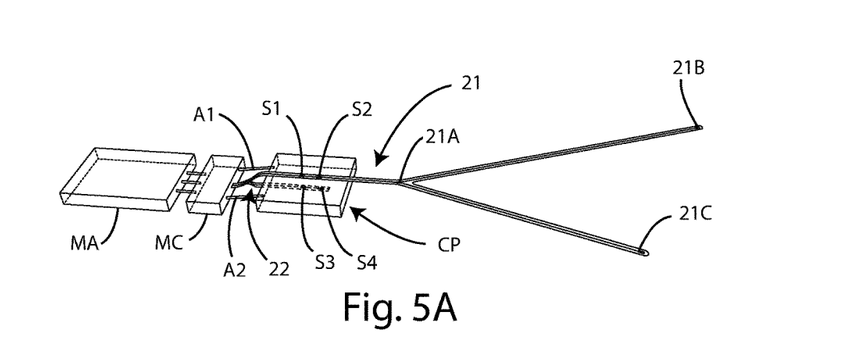
FIG. 5A is a perspective view showing the first flexible printed circuit and the second flexible printed circuit, each connected to the logic control unit and has a portion in contact with a respective surface of the Peltier cell.
Figure 5B:
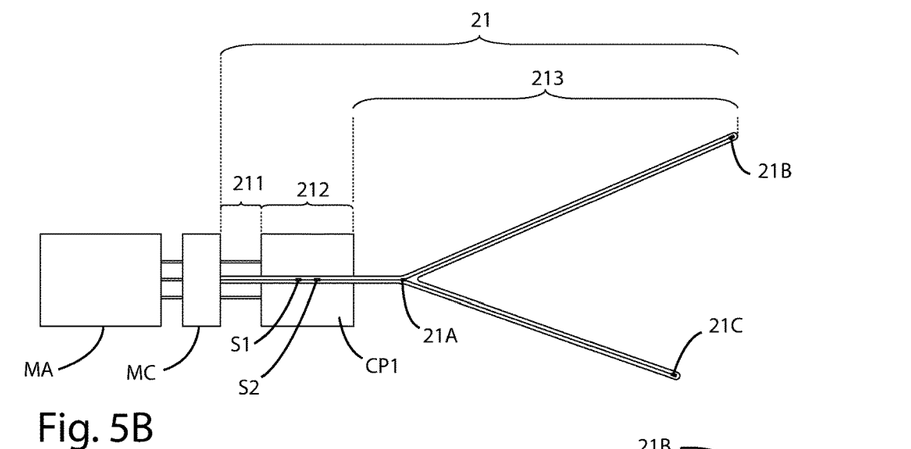
FIGS. 5B, 5C and 5D are respectively a top view, a bottom view, and a side view of FIG. 5A.
Figure 5C:
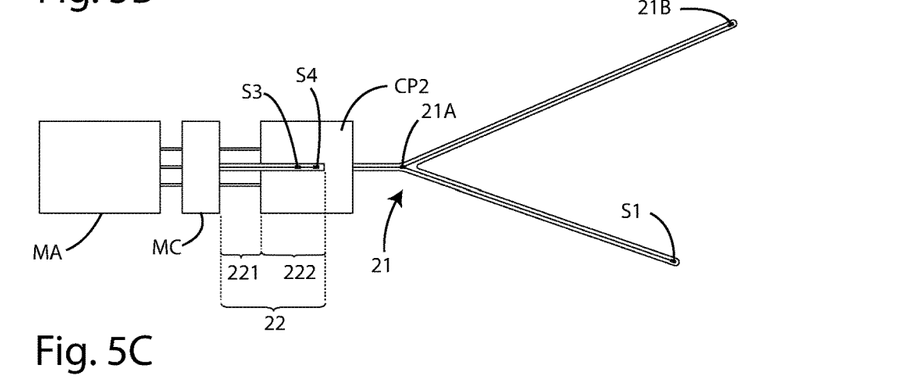
Figure 5D:
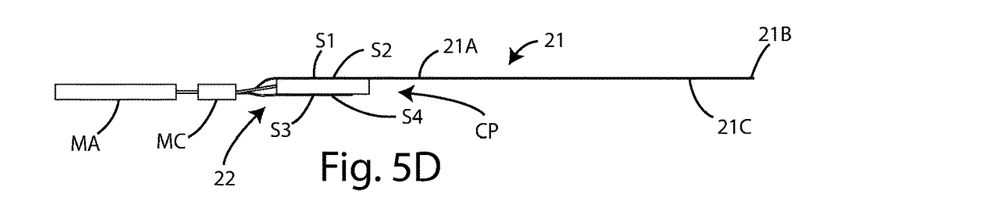

With reference to the first flexible printed circuit 21, said first flexible printed circuit comprises a first portion 211, connected to the logic control unit MC, a second portion 212, arranged in contact to the first surface CP1 of the Peltier cell CP, a third portion 213, arranged in contact with the first surface 2A of the second heat insulating layer 2.

Figure 1:
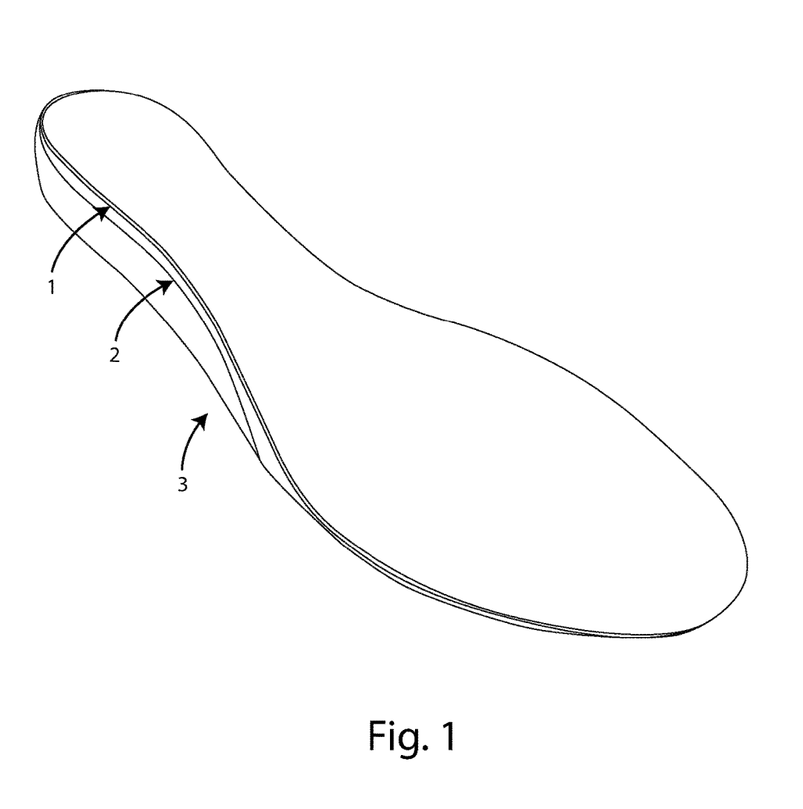
FIG. 1 is an insole view, according to the invention.
Figure 2:
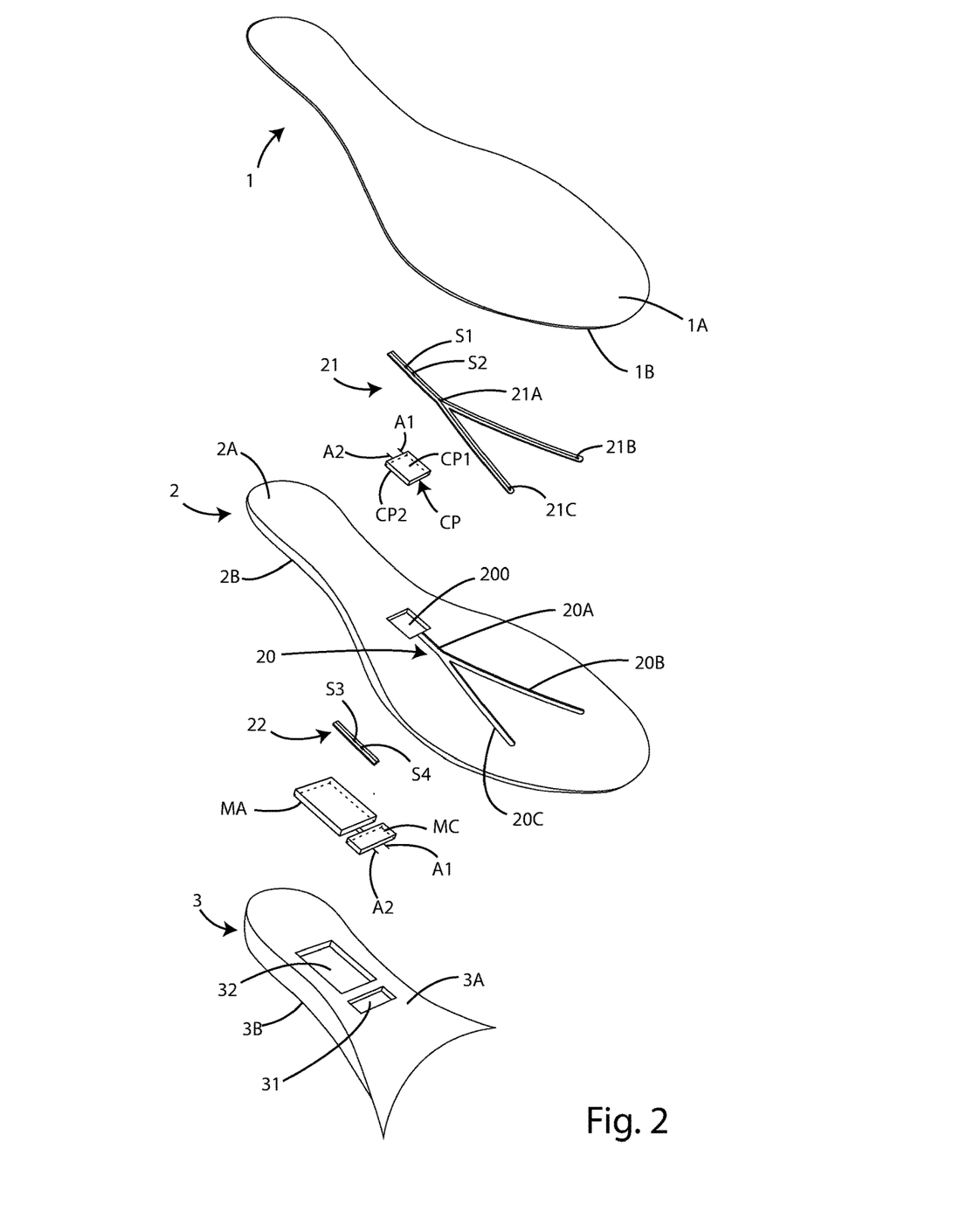
FIG. 2 is an insole exploded view, according to the invention.
Figure 3:
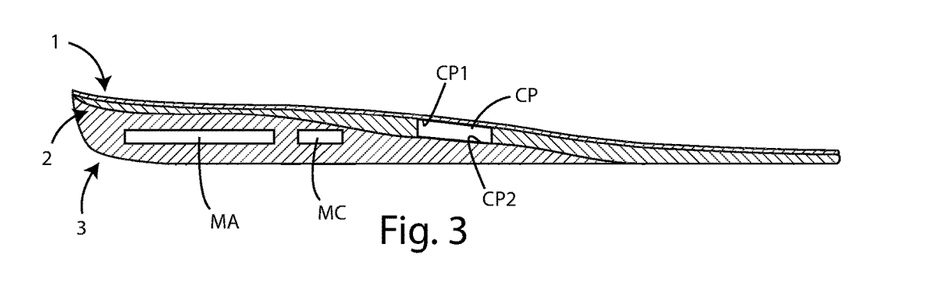
FIG. 3 is a sectional side view of the insole, which is the object of the invention.

As showed in the embodiment being described, it is preferable that said second heat insulating layer 2 has a third seat 20, arranged on the first surface 2A, and that said third portion 213 of the first flexible printed circuit 21 is located in said third seat 20.

It is preferable that said third seat 20 has a depth equal to the thickness of said first flexible printed circuit 21 and a width equal to the width of the first flexible printed circuit.

Moreover, it is preferable that said third portion 213 is pronged and that said third seat 20 is Y shaped and comprises:
a first branch 20A extending substantially from the center of the sole foot (which is substantially in correspondence of a portion of the scafoid bone or navicular bone) to a first point of the foot, substantially disposed between the second cuneiform and the third cuneiform,
a second branch 20B extending substantially from said fist point of the foot to a second point of the foot, substantially disposed between the metatarsal bone and the proximal phalanx of the big toe, and
a third branch 20C, extending substantially from said first point of the foot to a third point of the foot, substantially disposed between the metatarsal bone and the proximal phalanx of the fifth toe.

In the embodiment being described, said third seat 20 is a groove.

As it can be seen, since the through hole 200 is arranged in correspondence of the center of the foot sole, an extremity portion of said first branch is adjacent to said through hole 200.

Said first flexible printed circuit 21 comprises inside three temperature sensors to detect the foot temperature in respective points of the foot, subdivided as follows:
- a first temperature sensor 21A, arranged substantially in correspondence of said first point of the foot,
- a second temperature sensor 21B, arranged substantially in correspondence of said second point of the foot,
- a third temperature sensor 21C, arranged substantially in correspondence of said third point of the foot.

Consequently, each of those said temperature sensors is disposed inside the third portion 213 of said first flexible printed circuit 21.

It is preferable that said temperature sensors 21A, 21B, 21C are miniaturised temperature sensors, and that preferably are NTC temperature sensors.

However, the first flexible printed circuit does not need to comprise inside three temperature sensors.

In fact, although not shown in the figures, said first flexible printed circuit 21 may comprise inside any number of temperature sensors, even a single temperature sensor, without thereby leaving the scope of the invention.

Consequently, it is necessary that said first flexible printed circuit 21 comprises at least one temperature sensor (thus said third portion 213 does not need to be pronged).

With reference to the second flexible printed circuit 22, said second flexible printed circuit 22 comprises a first portion 221, linked to the logic control unit MC, and a second portion 222, arranged in contact with the second surface CP1 of the Peltier cell CP.

With reference to the first flexible print circuit 21 and to the second flexible printed circuit 22, it is preferable that said second heat insulating layer 2 has a fourth seat (not shown) to arrange the first portion 211 of the first flexible printed circuit 21 and a fifth portion (not shown) to arrange the first portion 221 of the second flexible printed circuit 22.

Each of said fourth seat and said fifth that seat may be a cavity, disposed inside said second heat insulating layer.

Moreover, as described later, said first flexible printed circuit 21 comprises inside a further first temperature sensor S1 and a further second temperature sensor S2 to measure the temperature of the first surface CP1 of the Peltier cell CP and said second flexible printed circuit 22 comprises inside a further third temperature sensor S3 and a further fourth temperature sensor S4 to measure the temperature of the second surface CP2 of the Peltier cell CP.

With reference to the power supply means MA, said power supply means MA may comprise a battery, preferably a Lithium-ion battery.

Said power supply means MA may be rechargeable power supply means and may be recharged through electromagnetic induction.

In this specific case, said power supply means MA are arranged in contact with a charging station that sends a electromagnetic energy signal, through an inductive coupling, to said power supply means MA that storage the energy inside the battery.

With reference to the Peltier cell CP, the first surface CP1 contacts at least partially the first heat conductive layer 1, and at least partially the third heat dissipating layer 3.

Moreover, it comprises two power cord, of which the first power cord A1 and a second power cord A2.

More specifically, the first surface CP1 of the Peltier cell CP contacts at least partially the second surface 1B of the first heat conductive layer 1 and the second surface CP2 of the Peltier cell CP contacts at least partially the first surface 3A of the third heat dissipating layer 3.

In fact, despite the presence of the first flexible printed circuit 21, which the second portion 212 contacts the first surface CP1 of the Peltier cell CP, part of the first surface CP1 of the Peltier cell CP contacts the second surface 1B of the first heat conductive layer 1, since the width of said first surface CP1 is greater than the width of the first flexible printed circuit 21.

In fact, each flexible printed circuit 21, 22 has a width between 1 mm and 3 mm and a thickness between 0,2 mm and 0.5 mm, whereas each surface CP1, CP2 of the Peltier cell CP has 20 mm×20 mm of dimensions (or 30 mm×30 mm) and has a width between 2.8 mm and 3.5 mm. In any case, each surface of the Peltier cell CP has a greater width than the width of each flexible printed circuit.

Moreover, despite the presence of the second flexible printed circuit 22, of which the second portion 222 contacts the second surface CP2 of the Peltier cell CP, part of the second surface CP2 of the Peltier cell CP contacts the first surface 3B of the third heat dissipating layer 3, since the width of said second surface CP1 is greater than the width of the second flexible printed circuit 22.

The fact that the Peltier cell CP has the first surface CP1 in contact (at least partially) with the first heat conductive layer 1 made of fabric, implies that a heat quantity is transferred from said first surface CP1 to said first heat conductive layer 1 and the fact that the second surface CP2 is in contact (at least partially) with the third heat dissipating layer 3 implies that a further heat quantity is transferred from said second surface CP2 to the third heat dissipative layer 3.

The Peltier cell CP is configured in such a way that when a first potential difference between said two power cords A1, A2 is applied, the first surface CP1 (or the second surface CP2) is heated and the second surface CP2 (or the first surface CP1) is cooled and when a second potential difference between said power cords A1, A2 with a sign opposite to said first potential difference is applied, the first surface CP1 (or the second surface CP2) is cooled and the second surface CP2 (or the first surface CP1) is heated.

Consequently, when the Peltier cell CP is turned on, said Peltier cell has one heated surface whereas the other surface is cooled.

In particular, the Peltier cell has a predetermined polarity such that the first surface CP1 of the Peltier cell CP may be heated or cooled.

Consequently, the second surface CP2 of the Peltier cell (opposite to said first surface CP1) is cooled, when the first surface CP1 is heated, and is heated, when the first surface CP1 is cooled.

Figure 4:
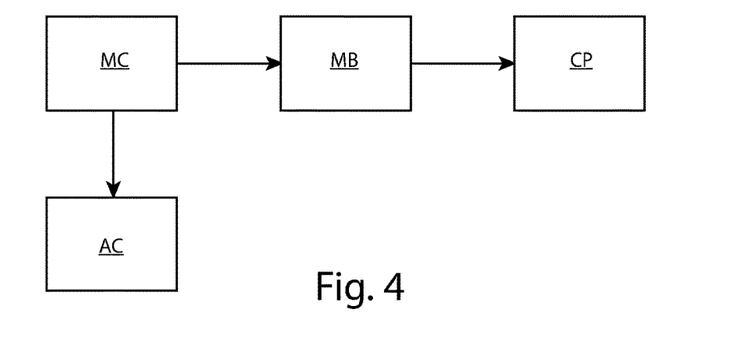
FIG. 4 schematically shows the connection of the logic control unit to an accelerometer and, via a H-bridge, to a Peltier cell.

As said, the logic control unit MC is configured to reverse said predetermined polarity between said H-bridge indicated with the reference HB.

Then, if the predetermined polarity of the Peltier cell CP is such that, when the Peltier cell CP is turned on, the first surface CP1 is heated, it may be cooled by inversion of said predetermined polarity of said first surface CP1.

If the predetermined polarity of the Peltier cell CP is such that, when the Peltier cell CP is turned on, the first surface CP1 is cooled, it may be heated by inversion of said predetermined polarity of said first surface CP1.

In other words, via said H-bridge, each surface of the Peltier cell CP may be heated/cooled, with the consequent cooling/heating of the opposite surface.

Figure 6:
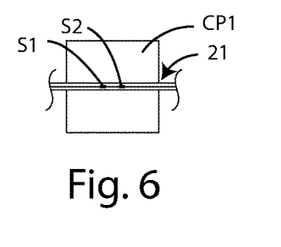
FIG. 6 shows in particular the portion of the first flexible printed circuit in contact with the first surface of the Peltier cell.
Figure 7:
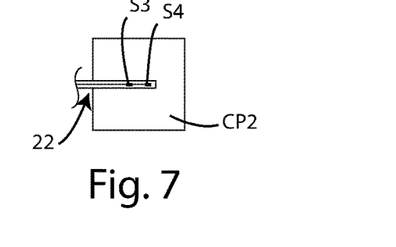
FIG. 7 shows in particular the portion of the second flexible printed circuit in contact with the second surface of the Peltier cell.

In order to monitor the temperature of the Peltier cell CP, as it can be seen in particular in FIGS. 6 and 7, said insole comprises:

- a further first temperature sensor S1 and a further second temperature sensor S2 to detect the temperature of the Peltier cell in the respective points of the its first surface CP1, and
- a further third temperature sensor S3 and a further fourth temperature sensor S4, to detect the temperature of the Peltier cell in the respective points of the second surface CP2.

Said further first temperature sensor S1 and said further second temperature sensor S2 are arranged inside the said first flexible printed circuit 21 (inside which, as said above, the three temperature sensors 21A, 21B, 21C are arranged).

In particular, said further first temperature sensor S1 and said further second temperature sensor S2 are arranged inside the second portion 212 of the first flexible printed circuit 21, in contact with the first surface CP1 of the Peltier cell CP.

In other words, said first flexible printed circuit 21 extends from the logic control unit MC to the first surface 2A of the second heat insulating layer 2, in order that the second portion 212 contacts the first surface CP1 of the Peltier cell CP (so that said further first temperature sensor S1 and said further second temperature sensor S2 are in correspondence of the respective points of the first surface CP1 of the Peltier cell CP) and its third portion 213 is arranged in the third seat 20 (so that the temperature sensors 21A, 21B and 21C are arranged in correspondence of the respective points of the foot).

Said further third temperature sensor S3 and said further fourth temperature sensor S4 are arranged inside the second flexible printed circuit 22.

In particular said third further temperature sensor S3 and said further fourth temperature sensor S4 are arranged inside the second portion 222 of said second flexible printed circuit 22 in contact with the second surface CP2 of the Peltier cell CP.

In other words, said second flexible printed circuit 22 extends from the logic control unit MC to the second surface CP2 of the Peltier cell CP so that said second portion 222 contacts the second surface CP2 of the Peltier cell CP (so that said further third temperature sensor S3 and said further fourth temperature sensor S4 correspond to the respective points of the second surface CP2 of the Peltier cell CP.

Advantageously, the fact that on each surface CP1, CP2 of the Peltier cell CP two further temperature sensors are respectively arranged, in case of damage of one of those said two further temperature sensors arranged on the same surface of the Peltier cell, allows the identification of said further damaged temperature sensor through the logic control unit MC. In this specific case, the logic control unit MC, despite being connected to said further damaged temperature sensor, only considers the temperature value given by the further temperature sensor arranged on the same surface of the Peltier cell on which is arranged the further damaged temperature sensor.

In addition, since on each surface CP1, CP2 of the Peltier cell CP two further temperature sensors are respectively arranged, it is possible to obtain an average temperature value for each surface of the Peltier cell through the logic control unit (as illustrated later).

However, although not shown, the presence of four further temperature sensors arranged on the Peltier cell is not needed.

In particular, the presence of said further first temperature sensor and of said further second temperature sensor on the first surface of the Peltier cell CP is not needed.

Said insole may comprise only said further first temperature sensor S1, arranged inside the first flexible printed circuit 22, in correspondence to a predetermined first point of the first surface CP1 of the Peltier cell CP, and preferably said further second temperature sensor S2, arranged inside said flexible printed circuit 21, in correspondence to a predetermined second point of the first surface CP1 of the Peltier cell CP, different from said predetermined first point.

The presence of said further first temperature sensor S1 and of said further second temperature sensor S2 ensure a correct temperature measure of the first surface CP1 of the Peltier cell CP.

This is important because the first surface CP1 of the Peltier cell CP is the surface of the Peltier cell responsible of the heating and cooling of the first heat conductive layer 1 made of fabric.

In the light of what has been said above, the presence of said further third temperature sensor S3 and of said further fourth temperature sensor S4, arranged inside the second flexible printed circuit 22 in correspondence of a respective point of the second surface CP2 of the Peltier cell CP, is not needed.

However, it is preferable that said further third temperature sensor S3 is arranged inside the second flexible printed circuit 22 in correspondence to a predetermined third point of the second surface CP2 of the Peltier cell CP and it is preferable that even said further fourth temperature sensor S4 is arranged inside the said second flexible printed circuit 22 in correspondence of a predetermined fourth point of said second surface CP2 of the Peltier cell CP.

The presence of said further third temperature sensor S3 and of said further fourth temperature sensor S4 ensures a careful measurement of the second surface CP2 of the Peltier cell CP.

As said for the temperature sensors mentioned above, it is preferable that said further temperature sensors S1, S2, S3, S4 are miniaturized NTC temperature sensors.

In other words, the first flexible printed circuit 21 comprises inside said three temperature sensors 21A, 21B, 21C, and said further first temperature sensor S1 and said further second temperature sensor S2 and the second flexible printed circuit 22 comprises inside said further third temperature sensor S3 and said further forth temperature sensor S4.

In particular, the first flexible printed circuit 21 comprises a first face and a second face, opposite to said first face, between which said first temperature sensor 21A, said second temperature sensor 21B and said third temperature sensor 21C are arranged, as well as said further first temperature sensor S1 and said further second temperature sensor S2.

The second flexible printed circuit 22 comprises a first face and a second face, opposite to said first face, between which said further third temperature sensor S3 and said further forth temperature sensor S4 are arranged.

With reference to the temperature sensors, depending on the number of temperature sensors, said first flexible printed circuit 21 may comprise inside (between its first face and its second face) the first temperature sensor 21A, or the first temperature sensor 21A and the second temperature sensor 21B, or the first temperature sensor 21A, the second temperature sensor 21B and the third temperature sensor 21C.

With reference to the further temperature sensors, depending on the number of the further temperature sensors, said first flexible printed circuit 21 may comprise inside (i.e. between its first face and its second face) said further first temperature sensor S1 or said further first temperature sensor S1 and said further second temperature sensor S2.

Said second flexible printed circuit 22 may comprise inside (i.e. between its first face and its second face) said further third temperature sensor S3 or said further third temperature sensor S3 and said further fourth temperature sensor S4.

However, the presence of the second flexible printed circuit 22 is preferable, but not necessary, since the first temperature sensor 21A and the further temperature sensor S1 are needed, both arranged inside the first flexible printed circuit 21.

With particular reference to the first heat conductive layer 1 made of fabric, said first heat conductive layer allows a certain quantity of heat of the first surface CP1 of the Peltier cell CP to be substantially distributed throughout the whole first heat conductive layer 1.

Consequently, if the first surface CP1 of the Peltier cell CP is heated, the first heat conductive layer 1 is heated, whereas if the first surface CP1 of the Peltier cell CP is cooled, the first heat conductive layer 1 is cooled.

In the embodiment being described, said first heat conductive layer 1 comprises a predetermined first amount of graphene and a predetermined first amount of polymeric matrix material. In particular, said predetermined first amount of graphene is in the form of platelets and is dispersed in said predetermined first amount of polymeric matrix material.

It is preferable that in terms of percentages said predetermined first amount of graphene is between 3% and 20%, preferably between 6% and 15%, and that said predetermined first amount of polymeric matrix material is between 80% and 97%, preferably between 85% and 94%.

The graphene platelets may be graphene platelets having a number of layers between 1 and 4.

In the example being described, said first heat conductive layer 1 comprises a predetermined first amount of graphene equal to 7% and were used graphene platelets having a number of layers equal to 2 layers.

Moreover, said first heat conductive layer 1 has a height comprised between 0.5 mm and 2 mm.

However, said first heat conductive layer (1) may be produced with any nanomaterials (such as nano-diamonds) or with any conductive material.

For example, as an alternative, said first heat conductive layer 1 may be made of a fabric of fibres of silver, in particular a Silverell© fabric.

When said first heat conductive layer 1 is made with a Silverell© fabric, the said third heat dissipating layer 3 may comprise a predetermined second amount of graphene and a predetermined second quantity of polyurethane, where said predetermined second amount of graphene is between 3% and 20%, and said predetermined second amount of polyurethane is between 80% and 97%.

Similarly to what has been said about the embodiment being illustrated, said predetermined second amount of graphene may be in the form of platelets and dispersed in said predetermined second amount of polyurethane; where the graphene platelets of said second predetermined amount of graphene have a number of layers between 1 and 4, preferably 2.

With particular reference to the second heat-insulating layer 2, said second heat-insulating layer serves to isolate the first surface CP1 of the Peltier cell CP from the second surface CP2 of the Peltier cell CP itself.

The through hole 200 allows the Peltier cell CP, positioned inside it, to be in contact with the heat conductive layer 1, through its first surface CP1, and with the third heat dissipating layer 3, via its second surface CP2.

Therefore, regardless of the shape and dimensions of the second surface 1B of the heat conductive layer 1 and the first surface 3A of the third heat dissipating layer 3, it is necessary that the Peltier cell CP contacts said heat conductive layer 1 and said third heat dissipating layer 3.

Said second heat-insulating layer 2 is made of polyurethane, preferably with a height between 1 mm and 3 mm.

Said polyurethane is the combination of two liquid components which are polyol and isocyanate and in the example illustrated, the weight ratio between polyol and isocyanate is 100 to 84.

With particular reference to the third heat dissipating layer 3, said third heat dissipating layer is needed to dissipate the heat of the second surface CP2 of the Peltier cell CP.

The first surface 3A of said third heat dissipating layer must be in contact with the portion of the second heat-insulating layer 2 in correspondence of which the Peltier cell CP is positioned.

In fact, the first surface 3A of said third heat dissipating layer 3 has the shape and dimensions such that the second surface CP2 of said Peltier cell CP contacts with the first surface 3A of said third layer 3.

In other words, the shape and dimensions of the first surface 3A of the third heat dissipating layer 3 are such that said first surface 3A contacts at least one portion of said second surface 2B of the second heat insulating layer 2 such that the second surface CP2 of the Peltier cell CP contacts the first surface 3A of said third heat dissipating layer 3.

In the example being described, said accelerometer AC is configured to detect an acceleration (hence a foot motion), and send a signal to the logic control unit MC to communicate to the logic control unit itself whether an acceleration has been detected or not detected over a predetermined time period.

The logic control unit MC is configured to turn on/off said power sources (MA) so that the Peltier cell CP, the temperature sensors 21A, 21B, 21C and the other temperature sensors S1, S2, S3, S4 are turned on when an acceleration is detected and off when no acceleration is detected.

In the embodiment being described, said accelerometer AC is a three-axis accelerometer to detect the variations in speed in the three directions of space.

Advantageously, said three-axis accelerometer may be used as a pedometer.

However, said accelerometer AC may also be a six-axis accelerometer or an accelerometer to nine axes, without thereby leaving from the scope of the invention.

In addition, said power supply means MA may be arranged inside a protective casing, and said logic control unit MC and said accelerometer AC can be arranged within a further protective casing.

Said protective casing and said further protective casing can be made of plastic material.

In the embodiment being described, said third heat dissipating layer 3 comprises a predetermined second amount of graphene and a predetermined second amount of polyurethane, where said second predetermined amount of graphene is greater than said predetermined first amount of graphene present in the first heat conductive layer 1.

In particular, said predetermined second amount of graphene is in the form of platelets and is dispersed in said predetermined second quantity of polyurethane.

It is preferable that in terms of percentage said predetermined second amount of graphene is between 3% and 20%, preferably between 6% and 15%, and said predetermined second amount of polyurethane is between 80% and 97%, preferably between 85% and 94%.

The graphene platelets may be graphene platelets having a number of layers between 1 and 4.

In the example being described, a predetermined second amount of graphene equal to 14% and a predetermined second amount of polyurethane equal to 86% has been selected and graphene platelets with a number of layers equal to 2 have been used.

In particular, said predetermined second amount of graphene and said predetermined second amount of polyurethane are in the form of foam or sponge or in liquid form.

In addition, the height of said third heat dissipating layer 3 is comprised between 2 mm and 5 mm.

In the embodiment being described, said third heat dissipating layer 3 extends substantially from the heel to the center of the sole of the foot.

In any case, it is necessary that a portion of the first surface 3A of said third heat dissipating layer 3 contacts the second surface CP2 of the Peltier cell CP.

In a first alternative, said third heat dissipating layer 3 has a uniform height.

In a second alternative, said third heat dissipating layer 3 has a first portion extending from the heel to the center of the foot sole for a further predetermined length and has a first height and a second portion in correspondence to the remaining portion of the foot sole having a second height decreasing towards the foot toes.

For example, said first height may be equal to 4 mm and said second height may decrease up to 2 mm.

The choice to use predetermined amounts of graphene in combination with predetermined amounts of polyurethane for both the first heat conductive layer 1 and the third heat dissipating layer 3 has a two advantages.

A first advantage is that the amount of heat transferred to the first heat conductive layer 1 and the amount of heat dispersed by said third heat dissipating layer 3 are maximized.

A second advantage is related specifically to the use of limited amounts of graphene.

In fact, since graphene is an expensive material to buy, limiting the amount of graphene to be used means lowering costs.

To avoid possible heat dissipation problems that may damage the Peltier cell during operation, it is desirable, as evidenced by the amount of graphene mentioned above referred to the first heat conductive layer 1 and the third heat dissipating layer 3, that the amount of graphene present in the third heat dissipating layer 3 (i.e. the predetermined second amount of graphene) is chosen to be greater than the amount of graphene present in the first heat conductive layer 1 (i.e. the predetermined first amount of graphene).

The greater amount of graphene in the third heat dissipating layer 3 improves the heat conductivity properties. Therefore, said third heat dissipating layer 3 is capable of dispersing a greater amount of heat than that transferred from the first surface of the Peltier cell to the first heat conductive layer 1.

Consequently, the amount of heat transferred from the first surface CP1 of the Peltier cell CP is less than the additional amount of heat transferred from said second surface CP2 of the Peltier cell CP to the third heat dissipating layer 3.

Advantageously, a quantity of heat is dispersed by said third heat dissipating layer 3 without the need to use one or more metal heat sinks (such as silver, copper and aluminum) which are rigid and occupy a significant volume, and hence they are not eligible to be included in an insole.

The combination of graphene and polyurethane allows to obtain a high thermal efficiency, without compromising comfort of the foot.

In fact, the user whose foot is leaning on the insole, arranged inside a shoe, does not feel that the foot is in contact with layers of different materials.

However, said third heat dissipating layer 3 can be made with any nanomaterials (such as nanodiamonds).

Said logic control unit MC is configured to:
communicate with said accelerometer AC to know whether a foot is in contact with said insole,
turn on and off said Peltier cell CP, each temperature sensor, each further temperature sensor, respectively, when the foot is in contact with said insole and when the foot is not in contact with said insole,
acquiring the temperature value from said temperature sensors 21A, 21B, 21C,
calculate the average temperature value,
comparing the said temperature value with a predetermined temperature range comprised between a predetermined first temperature threshold and a predetermined second temperature threshold, where said predetermined second temperature threshold is greater than said predetermined first temperature threshold,
turn on the Peltier cell CP so that its first surface CP1 is heated, when said average temperature value of the foot is less than said predetermined first temperature threshold, or turn on the cell Peltier CP and reverse said predetermined polarity of said Peltier cell CP via said H-bridge HB, so that the first surface CP1 cooled, when said average temperature value is greater than said predetermined second temperature threshold,
acquiring the temperature value detected by said further first temperature sensor S1, and by said further second temperature sensor S2,
calculate the average temperature value of the first surface CP1 of the Peltier cell CP,
comparing the temperature value of the first surface CP1 of the Peltier cell CP with a predetermined third temperature threshold,
turn off the Peltier cell CP when said average temperature value of the first surface CP1 of the Peltier cell CP is higher or lower than the predetermined third temperature threshold.
acquiring the temperature value detected by said further third temperature sensor S3, and by said further fourth temperature sensor S4,
calculate the average temperature value of the second surface CP2 of the Peltier cell CP,
comparing said the average temperature value of the second surface CP2 of the Peltier cell CP with a predetermined fourth temperature threshold,
turn off the Peltier cell CP when the average temperature value of the second surface CP2 of the Peltier cell CP is higher or lower than the predetermined fourth temperature threshold.

In the example being described, the predetermined polarity of the Peltier cell CP is chosen in order that, when the Peltier cell CP is on, the first surface CP1 is heated and that, by reversing said predetermined polarity, the first surface CP2 is cooled.

However, the predetermined polarity of the Peltier cell CP may be chosen in order that when the Peltier cell CP is on, the first surface CP1 is cooled down and, by reversing said predetermined polarity, the first surface CP1 is heated without leaving the scope of the invention.

In this case, the logic control unit MC is configured to turn on the Peltier cell CP so that the first surface CP1 is cooled, when said average temperature value is greater than said predetermined second temperature threshold, or turn on the Peltier cell CP and reverse its predetermined polarity by said H-bridge so that the first surface CP1 is heated when said average temperature value is less than said predetermined first temperature threshold.

It is preferable that said predetermined temperature range is centered on a temperature value equal to 36.5° C. and said predetermined first temperature threshold is 30.5° C. and said second temperature threshold is 42.5° C.

In other words, said predetermined temperature range is between 30.5° C. and 42.5° C.

Since at least the first temperature sensor 21A and the further first temperature sensor S1 inside the first flexible printed circuit 21, the logic control unit MC is connected to said first temperature sensor 21A and said further first temperature sensor S1, by means of said flexible printed circuit 21, and is configured to:
communicate with said accelerometer AC to know whether a foot contacts said insole,
turn on and off said Peltier cell CP, said at least one first temperature sensor 21A, said at least one further first temperature sensor S1, respectively, when the foot is in contact with said insole and when the foot is not in contact with said insole,
acquiring the temperature value detected by said at least one first temperature sensor 21A,
comparing the said temperature value detected by said at least one first temperature sensor 21A with a predetermined temperature range comprised between a first temperature threshold and a second temperature threshold,
turn on the Peltier cell CP so that its first surface CP1 is heated, when said temperature value is less than said predetermined first temperature threshold, or turn on the cell Peltier CP and reverse said predetermined polarity of said Peltier cell CP via said H-bridge HB, so that the first surface CP1 is cooled, when said temperature value is greater than said predetermined second temperature threshold,
acquiring the temperature value detected by said further first temperature sensor S1,
comparing said temperature value acquired from said further first temperature sensor S1 with a predetermined third temperature threshold,
turn off the Peltier cell CP when said temperature value of said first surface CP1 of the Peltier cell CP is higher or lower than the predetermined third temperature threshold.

It is clear that in the case where only a first temperature sensor and a further first temperature sensor are arranged within the first flexible printed circuit 21, the logic control unit MC neither calculates any average value referred to the foot temperature nor to the temperature of the Peltier CP cell.

As already said, the predetermined polarity of the Peltier cell CP may be chosen in order that, when the Peltier cell CP is turned on, the first surface CP1 is cooled and that, by reversing said predetermined polarity, the first surface CP1 is heated. In this case, the logic control unit MC is configured to turn on the
Peltier cell CP in order that the first surface CP1 is cooled, when said average temperature value is greater than said predetermined second temperature threshold, or turn on the Peltier cell CP and reverse its predetermined polarity by said H-bridge so that the first surface CP1 is heated when said average temperature value is less than said predetermined first temperature threshold.

When a further second temperature sensor S2 is arranged inside the first flexible printed circuit 21 in correspondence to a respective point CP1 of the first surface of the Peltier cell CP, the logic control unit MC is connected to said further second temperature sensor S2, by means of said flexible printed circuit 21, and is configured to:
acquire the temperature value from said further second temperature sensor S2,
calculate the temperature average value between the temperature values of said further first temperature sensor S1 and said further second temperature sensor S2,
compare said temperature average value of said first surface CP1 of the Peltier cell CP with said predetermined third temperature threshold,
turn off the Peltier cell CP when said temperature average value of said first surface CP1 of the Peltier cell CP is higher or lower than the predetermined third temperature threshold.

When a further third temperature sensor S3 is arranged within the second flexible printed circuit 22 in correspondence to a respective point of the second surface CP2 of the Peltier cell CP, for detecting the temperature in a respective point of said second surface CP2 of said Peltier cell CP, the logic control unit MC is connected to said further third temperature sensor S3, by means of said second flexible printed circuit 22, and is configured to:
acquire the temperature value from said further third temperature sensor S3,
compare said temperature value of said second surface CP2 of the Peltier cell CP with a predetermined fourth temperature threshold,
turn off the Peltier cell CP when said temperature value of said second surface CP2 of the Peltier cell CP is higher or lower than the predetermined fourth temperature threshold.

When a further forth temperature sensor S4 is arranged within the second flexible printed circuit 22 in correspondence to a respective point of the second surface CP2 of the Peltier cell CP, the logic control unit MC is connected to said further forth temperature sensor S4, by means of said second flexible printed circuit 22, and is configured to:
acquire the temperature value from said further forth temperature sensor S4,
calculate the average temperature value of said second surface CP2 of the Peltier cell CP between the temperature values of said further third temperature sensor S3 and said further forth temperature sensor S4,
compare said average temperature value of said second surface CP2 of the Peltier cell CP with a said predetermined fourth temperature threshold,
turn off the Peltier cell CP when said average temperature value of said second surface CP2 of the Peltier cell CP is higher or lower than the predetermined fourth temperature threshold.

Furthermore, by means of said further third temperature sensor S3 and said further forth temperature sensor S4, said logic control unit MC may verify whether the Peltier cell CP has heat dissipation problems.

For example, if the second surface CP2 of the Peltier cell CP is expected to cool/heat and said second surface does not cool/heat, the said logic control unit MC turns off the Peltier cell CP for a period of time until the average temperature value given by said further third temperature sensor S3 and by said further forth temperature sensor S4 is less than a predetermined fifth temperature threshold or greater than a predetermined sixth temperature threshold.

In this way, the logic control unit MC may verify the correct operation of the Peltier cell CP.

In other words, said logic control unit MC is configured to:
verify if the temperature average value between the temperature values of said further third temperature sensor S3 and said further fourth temperature sensor S4 is lower than a predetermined fifth temperature threshold or greater than a predetermined sixth temperature threshold,
turn off the Peltier cell CP until said temperature average value is less than said fifth predetermined temperature threshold or higher than the predetermined sixth temperature threshold.

In the case where only said further third temperature sensor is arranged inside the second flexible printed circuit 22, in correspondence to a respective point of the second surface CP2 of the Peltier cell CP, said logic control unit MC is configured to:
verify if the temperature value of said further third temperature sensor S3 is lower than a predetermined fifth temperature threshold or greater than a predetermined sixth temperature threshold,
turn off the Peltier cell CP until said temperature value is less than said fifth predetermined temperature threshold or higher than the predetermined sixth temperature threshold.

Said predetermined fifth temperature threshold and said predetermined sixth temperature threshold are not necessarily equal respectively to the predetermined third temperature threshold and to the predetermined fourth temperature threshold which define a predetermined temperature range out of which the foot (in the course of time) may be exposed to damage.

Said predetermined fifth threshold and said predetermined sixth threshold are threshold determined depending on the correct operation of the Peltier cell CP.

The present invention is related to any shoe comprising the insole mentioned above.

Advantageously, as already mentioned, the insole, object of the invention, allows to control and adjust the temperature of the foot inside a shoe.

The present invention has been described for illustrative but not limitative purposes, according to its preferred embodiments, but it has to be understood that variations and/or modifications may be made by those skilled in the art without, for this reason,
leaving the relative scope of protection, as defined by the claims attached.

The invention claimed is:
1. An insole for controlling and adjusting the temperature of a foot, said insole comprising from top to bottom:
a first heat conductive layer (1) made of fabric, comprising a first surface (1A) intended to contact said foot, and a second surface (1B), opposite to said first surface (1A);
a second heat insulating layer (2), comprising a first surface (2A) in contact with the second surface (1B) of said first heat conductive layer (1), and a second surface (2B), opposite to said first surface (2A), where said second heat insulating layer (2) has a through hole (200), arranged substantially at the center of the foot sole, inside which a Peltier cell (CP) is arranged, said Peltier cell comprising a first surface (CP1) and a second surface (CP2), opposite to said first surface (CP1), where said first surface (3A) of said Peltier cell (CP) at least partially contacts the second surface (1B) of said first heat conductive layer (1); said Peltier cell (CP) having a predetermined polarity such that, when the Peltier cell (CP) is turned on, the first surface (CP1) of said Peltier cell (CP) is heated or cooled;
a third heat dissipating layer (3), comprising a first surface (3A) having shape and dimensions such as to contact at least partially said second surface (2B) of said second heat insulating layer (2) at the second surface (CP2) of said cell Peltier (CP), where said third heat dissipating layer (3) comprises:
a first seat (31) housing an accelerometer (AC) and a logic control unit (MC), where said logic control unit (MC) is connected to said accelerometer (AC) and, via an H-bridge (HB), to said cell Peltier (CP), and
a second seat (32) housing power supply means (MA), connected to said logic control unit (MC), for supplying said logic control unit (MC) and said Peltier cell, as well as said accelerometer (AC),
said insole further comprising:
a first flexible printed circuit (21) configured to measure the temperature of the foot and the first surface (CP1) of the Peltier cell (CP), comprising a first portion (211), connected to the logic control unit (MC), a second portion (212), arranged in contact to the first surface (CP1) of the Peltier cell (CP), and a third portion (213), arranged in contact with the first surface (2A) of said second heat insulating layer (2), where said first flexible printed circuit (21) comprises:
at least one first temperature sensor (21A) for detecting the temperature of the foot in a respective foot point, arranged inside said third portion (213) of said flexible printed circuit (21), and at least one further first temperature sensor (S1) for detecting the temperature in a respective point of said first surface (CP1) of said Peltier cell (CP), arranged inside said second portion (212) of said flexible printed circuit (21);
where
said accelerometer (AC) is configured to detect an acceleration and send a signal to said logic control unit (MC) to communicate that an acceleration has been detected or has not been detected in a predetermined period of time,
said logic control unit (MC) is connected to said at least one first temperature sensor (21A) and said at least one further first temperature sensor (S1), by means of said flexible printed circuit (21), and is configured to:
communicate with said accelerometer (AC) to know whether a foot is in contact with said insole,
turn on and off said Peltier cell (CP), said at least one first temperature sensor (21A), said at least one further first temperature sensor (S1), respectively, when the foot is in contact with said insole and when the foot is not in contact with said insole,
acquiring the temperature value detected by said at least one first temperature sensor (21A), comparing the said temperature value detected by said at least one first temperature sensor (21A) with a predetermined temperature range comprised between a predetermined first temperature threshold and a predetermined second temperature threshold, where said predetermined second temperature threshold is greater than said predetermined first temperature threshold, turn on the Peltier cell (CP) so that its first surface (CP1) is heated or cooled, when said temperature value is less than said predetermined first temperature threshold or greater than said predetermined second threshold temperature, or turn on the cell Peltier (CP) and reverse said predetermined polarity of said Peltier cell (CP) via said H-bridge (HB), so that the first surface (CP1) is cooled or heated, when said temperature value is greater than said predetermined second temperature threshold or less than the predetermined first temperature threshold, acquiring the temperature value detected by said further first temperature sensor (S1), comparing said temperature value acquired from said further first temperature sensor (S1) with a predetermined third temperature threshold, turn off the Peltier cell (CP) when said temperature value of said first surface (CP1) of the Peltier cell (CP) is higher or lower than the predetermined third temperature threshold.

2. The insole according to claim 1, wherein said second heat insulating layer (2) comprises a third seat (20), arranged on its first surface (2A), and said third portion (213) of said first flexible printed circuit (21) is housed in said third seat (20).

3. The insole according to claim 2, wherein said third portion (213) is pronged and said third seat (20) is substantially Y-shaped and comprises:
   a first branch (20A) extending substantially from the center of the foot to a first foot point, substantially disposed between the second cuneiform and the third cuneiform,
   a second branch (20B) extending substantially from said first foot point to a second foot point, substantially disposed between the metatarsal bone and the proximal phalanx of the big toe, and
   a third branch (20C) extending substantially from said first foot point to a third foot point, substantially disposed between the metatarsal bone and the proximal phalanx of the fifth toe.

4. The insole according to claim 3, wherein said at least one first temperature sensor (21A) is arranged substantially at said first foot point.

5. The insole according to claim 4, wherein
said flexible printed circuit (21) comprises inside a second temperature sensor (21B), arranged substantially at said second foot point, and a third temperature sensor (21C), arranged substantially at said third foot point,
wherein
said logic control unit (MC) is connected to said second temperature sensor (21B) and said third temperature sensor (21C), by means of said flexible printed circuit (21), and is configured to:
acquire the temperature values detected by said second temperature sensor (21B) and said third temperature sensor (21C),
calculate the temperature average value between the temperature values of said first temperature sensor (21A), said second temperature sensor (21B) and said third temperature sensor (21C),
compare said temperature average value with said predetermined temperature range comprised between said first threshold temperature and said second temperature threshold,
turn on the Peltier cell (CP) so that the first surface (CP1) is heated or cooled, when said temperature average value is less than said predetermined first temperature threshold or higher than the second temperature threshold, or turn on the Peltier cell (CP) and reverse said predetermined polarity of said Peltier cell (CP) via said H-bridge (HB), so that the first surface (CP1) is cooled or heated, when said mean temperature value is greater than said predetermined second threshold temperature or lower than said predetermined first temperature threshold.

6. The insole according to claim 1, wherein
said first flexible printed circuit (21) comprises inside a further second temperature sensor (S2) for detecting the temperature of said first surface (CP1) of said Peltier cell (CP), arranged inside said second portion (212) of said first flexible printed circuit (21),
wherein
said logic control unit (MC) is connected to said further second temperature sensor (S2), by means of said flexible printed circuit (21), and is configured to:
acquire the temperature value from said further second temperature sensor (S2),
calculate the temperature average value between the temperature values of said further first temperature sensor (S1) and said further second temperature sensor (S2),
compare said temperature average value of said first surface (CP1) of the Peltier cell (CP) with said predetermined third temperature threshold,
turn off the Peltier cell (CP) when said temperature average value of said first surface (CP1) of the Peltier cell (CP) is higher or lower than the predetermined third temperature threshold.

7. The insole according to claim 1, wherein said insole comprises a second flexible printed circuit (22) configured to measure the temperature of the second surface (CP2) of the Peltier cell (CP), comprising a first portion (221), connected to said logic control unit (MC), and a second portion (222), arranged in contact with the second surface (CP2) of said Peltier cell (CP), said second surface (CP2) of said Peltier cell (CP) contacting at least partially the first surface (3A) of said third heat dissipating layer (3);
wherein
said second flexible printed circuit (22) comprises a further third temperature sensor (S3) for detecting the temperature of said second surface (CP2) of said Peltier cell (CP), arranged inside said second portion (222) of said second flexible printed circuit (22),
wherein
said logic control unit (MC) is connected to said further third temperature sensor (S3), by means of said second flexible printed circuit (22), and is configured to:
acquire the temperature value from said further third temperature sensor (S3),
compare said temperature value of said second surface (CP2) of the Peltier cell (CP) with a predetermined fourth temperature threshold,
turn off the Peltier cell (CP) when said temperature value of said second surface (CP2) of the Peltier cell (CP) is higher or lower than the predetermined fourth temperature threshold.

8. The insole according to claim 7, wherein said logic control unit (MC) is configured to:

verify if the temperature value of said further third temperature sensor (S3) is lower than a predetermined fifth temperature threshold or greater than a predetermined sixth temperature threshold, turn off the Peltier cell (CP) until said temperature value is less than said fifth predetermined threshold temperature or higher than the predetermined sixth temperature threshold.

9. The insole according to claim 7, wherein
said second flexible printed circuit (22) comprises a further fourth temperature sensor (S4) for detecting the temperature of said second surface (CP2) of said Peltier cell (CP), arranged inside said second portion (222) of said second flexible printed circuit (22),
wherein
said logic control unit (MC) is connected to said further fourth temperature sensor (S4), by means of said second flexible printed circuit (22), and is configured to:
acquire the temperature value from said further fourth temperature sensor (S4),
calculate the temperature average value of said second surface (CP2) of the Peltier cell (CP) between the temperature values of said further third temperature sensor (S3) and said further quarter of a temperature sensor (S4),
compare said temperature average value of said second surface (CP2) of the Peltier cell (CP) with said fourth predetermined temperature threshold,
turn off the Peltier cell (CP) when said average value of temperature of said second surface (CP2) of the Peltier cell (CP) is higher or lower than the predetermined fourth temperature threshold.

10. The insole according to claim 9, wherein said logic control unit (MC) is configured to:
verify if said temperature average value between the temperature values of said further third temperature sensor (S3) and said further fourth temperature sensor (S4) is lower than a predetermined fifth temperature threshold or greater than a predetermined sixth temperature threshold,
turn off the Peltier cell (CP) until said temperature average value is less than said fifth predetermined temperature threshold or higher than the predetermined sixth temperature threshold.

11. The insole according to claim 1, wherein said first heat conductive layer (1) comprises a predetermined first amount of graphene and a predetermined first amount of polymeric matrix material, and said third heat dissipating layer (3) comprises a predetermined second amount of graphene and a predetermined second amount of polyurethane, where said second predetermined amount of graphene is greater than said predetermined first amount of graphene.

12. The insole according to claim 1, wherein
said first heat conductive layer (1) is a fabric of fibers of silver, in particular a Silverell© fabric, and
wherein
said third heat dissipating layer (3) comprises a predetermined second amount of graphene and a predetermined second quantity of polyurethane, where said predetermined second amount of graphene is between 3% and 20%, and said predetermined second amount of polyurethane is between 80% and 97%.

13. The insole according to claim 1, wherein said predetermined temperature range is centered on a temperature value equal to 36.5° C. and said predetermined first temperature threshold is 30.5° C. and said second temperature threshold is 42.5° C.

14. The insole according to claim 1, wherein said accelerometer (AC) is a three-axis accelerometer or a six-axis accelerometer or a nine-axis accelerometer.

15. A shoe comprising an insole according to claim 1.

16. The insole according to claim 2, wherein
said first flexible printed circuit (21) comprises inside a further second temperature sensor (S2) for detecting the temperature of said first surface (CP1) of said Peltier cell (CP), arranged inside said second portion (212) of said first flexible printed circuit (21),
wherein
said logic control unit (MC) is connected to said further second temperature sensor (S2), by means of said flexible printed circuit (21), and is configured to:
acquire the temperature value from said further second temperature sensor (S2),
calculate the temperature average value between the temperature values of said further first temperature sensor (S1) and said further second temperature sensor (S2),
compare said temperature average value of said first surface (CP1) of the Peltier cell (CP) with said predetermined third temperature threshold,
turn off the Peltier cell (CP) when said temperature average value of said first surface (CP1) of the Peltier cell (CP) is higher or lower than the predetermined third temperature threshold.

17. The insole according to claim 3, wherein
said first flexible printed circuit (21) comprises inside a further second temperature sensor (S2) for detecting the temperature of said first surface (CP1) of said Peltier cell (CP), arranged inside said second portion (212) of said first flexible printed circuit (21),
wherein
said logic control unit (MC) is connected to said further second temperature sensor (S2), by means of said flexible printed circuit (21), and is configured to:
acquire the temperature value from said further second temperature sensor (S2),
calculate the temperature average value between the temperature values of said further first temperature sensor (S1) and said further second temperature sensor (S2),
compare said temperature average value of said first surface (CP1) of the Peltier cell (CP) with said predetermined third temperature threshold,
turn off the Peltier cell (CP) when said temperature average value of said first surface (CP1) of the Peltier cell (CP) is higher or lower than the predetermined third temperature threshold.

18. The insole according to claim 4, wherein
said first flexible printed circuit (21) comprises inside a further second temperature sensor (S2) for detecting the temperature of said first surface (CP1) of said Peltier cell (CP), arranged inside said second portion (212) of said first flexible printed circuit (21),
wherein
said logic control unit (MC) is connected to said further second temperature sensor (S2), by means of said flexible printed circuit (21), and is configured to:
acquire the temperature value from said further second temperature sensor (S2),
calculate the temperature average value between the temperature values of said further first temperature sensor (S1) and said further second temperature sensor (S2),
compare said temperature average value of said first surface (CP1) of the Peltier cell (CP) with said predetermined third temperature threshold, turn off the Peltier cell (CP) when said temperature average value of said first surface (CP1) of the Peltier cell (CP) is higher or lower than the predetermined third temperature threshold.

19. The insole according to claim 5, wherein
said first flexible printed circuit (21) comprises inside a further second temperature sensor (S2) for detecting the temperature of said first surface (CP1) of said Peltier cell (CP), arranged inside said second portion (212) of said first flexible printed circuit (21),
wherein
said logic control unit (MC) is connected to said further second temperature sensor (S2), by means of said flexible printed circuit (21), and is configured to:
acquire the temperature value from said further second temperature sensor (S2),
calculate the temperature average value between the temperature values of said further first temperature sensor (S1) and said further second temperature sensor (S2),
compare said temperature average value of said first surface (CP1) of the Peltier cell (CP) with said predetermined third temperature threshold,
turn off the Peltier cell (CP) when said temperature average value of said first surface (CP1) of the Peltier cell (CP) is higher or lower than the predetermined third temperature threshold.

20. The insole according to claim 2, wherein
said insole comprises a second flexible printed circuit (22) configured to measure the temperature of the second surface (CP2) of the Peltier cell (CP), comprising a first portion (221), connected to said logic control unit (MC), and a second portion (222), arranged in contact with the second surface (CP2) of said Peltier cell (CP), said second surface (CP2) of said Peltier cell (CP) contacting at least partially the first surface (3A) of said third heat dissipating layer (3);
wherein
said second flexible printed circuit (22) comprises a further third temperature sensor (S3) for detecting the temperature of said second surface (CP2) of said Peltier cell (CP), arranged inside said second portion (222) of said second flexible printed circuit (22),
wherein
said logic control unit (MC) is connected to said further third temperature sensor (S3), by means of said second flexible printed circuit (22), and is configured to:
acquire the temperature value from said further third temperature sensor (S3),
compare said temperature value of said second surface (CP2) of the Peltier cell (CP) with a predetermined fourth temperature threshold,
turn off the Peltier cell (CP) when said temperature value of said second surface (CP2) of the Peltier cell (CP) is higher or lower than the predetermined fourth temperature threshold.

* * * * *